United States Patent
Wang et al.

(10) Patent No.: US 7,217,653 B2
(45) Date of Patent: May 15, 2007

(54) INTERCONNECTS FORMING METHOD AND INTERCONNECTS FORMING APPARATUS

(75) Inventors: Xinming Wang, Tokyo (JP); Daisuke Takagi, Tokyo (JP); Akihiko Tashiro, Tokyo (JP); Yukio Fukunaga, Tokyo (JP); Akira Fukunaga, Tokyo (JP)

(73) Assignee: Ebara Corporation, Tokyo (JP)

( * ) Notice: Subject to any disclaimer, the term of this patent is extended or adjusted under 35 U.S.C. 154(b) by 224 days.

(21) Appl. No.: 10/896,014

(22) Filed: Jul. 22, 2004

(65) Prior Publication Data

US 2005/0064702 A1    Mar. 24, 2005

(30) Foreign Application Priority Data

Jul. 24, 2003 (JP) .............................. 2003-201363

(51) Int. Cl.
   *H01L 21/4763* (2006.01)
(52) U.S. Cl. ...................... 438/633; 438/637; 438/672; 438/674; 438/675; 438/976; 257/E23.141; 257/E21.575; 257/E21.59; 257/E21.579
(58) Field of Classification Search ................ 438/633, 438/637, 648, 672, 674, 675, 976; 257/E23.141, 257/E21.575, E21.59, E21.579
See application file for complete search history.

(56) References Cited

U.S. PATENT DOCUMENTS

| | | | |
|---|---|---|---|
| 5,674,787 A | | 10/1997 | Zhao et al. |
| 5,695,810 A | | 12/1997 | Dubin et al. |
| 6,144,099 A | * | 11/2000 | Lopatin et al. ............. 257/758 |
| 6,265,328 B1 | | 7/2001 | Henley et al. |
| 6,267,853 B1 | | 7/2001 | Dordi et al. |
| 6,294,059 B1 | | 9/2001 | Hongo et al. |
| 6,734,559 B1 | * | 5/2004 | Yang et al. .................. 257/751 |
| 6,833,318 B2 | * | 12/2004 | Weng et al. ................. 438/631 |
| 6,838,370 B1 | * | 1/2005 | Niuya et al. ................ 438/623 |
| 6,905,964 B2 | * | 6/2005 | Lim et al. ................... 438/687 |
| 7,008,872 B2 | * | 3/2006 | Dubin et al. ................ 438/678 |
| 7,064,065 B2 | * | 6/2006 | Lopatin et al. ............. 438/678 |

* cited by examiner

*Primary Examiner*—Michelle Estrada
(74) *Attorney, Agent, or Firm*—Wenderoth, Lind & Ponack, L.L.P.

(57) ABSTRACT

The present invention provides an interconnects-forming method and an interconnects-forming apparatus which can minimize the lowering of processing accuracy in etching, minimize light exposure processing for the formation of interconnect recesses in the production of multi-level interconnects, improve the electromigration resistance of interconnects without impairing the electrical properties of the interconnects, and enhance the reliability of the device. The interconnects-forming method, includes providing interconnect recesses in an insulating film formed in a surface of a substrate; embedding an interconnect material in the interconnect recesses while forming a metal film of the interconnect material on a surface of the insulating film; removing an extra metal material other than the metal material in the interconnect recesses and flattening the substrate surface, thereby forming interconnects; forming a first protective film of a conductive material selectively on exposed surfaces of the interconnects; forming a second protective film on the surface of the substrate having the thus-formed first protective film; forming an interlevel insulating film on the surface of the substrate having the thus-formed second protective film; and flattening a surface of the interlevel insulating film.

39 Claims, 17 Drawing Sheets

INTERCONNECTS FORMING METHOD AND INTERCONNECTS FORMING APPARATUS

BACKGROUND OF THE INVENTION

1. Field of the Invention

The present invention relates to an interconnects-forming method and an interconnects-forming apparatus, and more particularly to an interconnects-forming method and an interconnects-forming apparatus for forming interconnects by filling an interconnect material (metal) into fine recesses for interconnects formed in a surface of a substrate, such as a semiconductor wafer.

2. Description of the Related Art

In recent years, instead of using aluminum or aluminum alloys as a material for forming interconnect circuits on a substrate such as a semiconductor wafer, there is an eminent movement towards using copper (Cu) which has a low electric resistivity and high electromigration resistance. Copper interconnects are generally formed by filling copper into fine interconnect recesses formed in a surface of a substrate. Various techniques for forming such copper interconnects are known, including CVD, sputtering, and plating. According to any such technique, a copper film is formed in a substantially entire surface of a substrate, followed by removal of unnecessary copper by chemical-mechanical polishing (CMP).

In the case of interconnects formed by such a process, embedded interconnects have exposed surfaces after performing a flattening processing. When an additional embedded interconnect structure is formed on such interconnects-exposed surface of a substrate, the following problems maybe encountered. For example, during formation of a new $SiO_2$ or a low-k material in a sequence process for forming an interlevel insulating film, exposed surfaces of pre-formed interconnects are likely to be oxidized. Further, upon etching of the $SiO_2$ or the low-k material for formation of via holes, the pre-formed interconnects exposed on the bottoms of the via holes can be contaminated with an etchant, a peeled resist, and the like.

In order to avoid such problems, it has been conventional to form a protective film of SiN or the like not only on a circuit-formed region of a substrate where surfaces of interconnects are exposed, but also on an entire surface of the substrate, thereby preventing contamination of these interconnects with an etchant, and the like.

However, when a protective film of SiN or the like, which generally has a low bonding power or adhesion to an interconnect material such as copper, is formed on an entire surface of a substrate, electrons are likely to move between interconnects and the protective film caused by electromigration. Furthermore, in a semiconductor device having an embedded interconnect structure, as a protective film generally has high dielectric constant k than a dielectric constant k of the conventional interlevel insulating film, the dielectric constant of the interlevel insulating film increases, thus inducing delayed interconnections even when a low-resistivity material such as copper or silver is employed for interconnects, whereby the performance of the semiconductor device may be impaired.

In view of this, it has been proposed to selectively cover surfaces of exposed interconnects with a protective film of Co (Cobalt), a Co alloy, Ni (Nickel) or a Ni alloy, exhibiting a good adhesion to an interconnect material such as copper or silver and having a low resistivity ($\rho$), for example, an alloy film which is obtained by electroless plating.

FIGS. 1A through 1D illustrate, in sequence of process steps, an example of forming such a semiconductor device having copper interconnects. As shown in FIG. 1A, an insulating film 2, such as an oxide film of $SiO_2$ or a film of low-k material, is deposited on a conductive layer 1a on a semiconductor base 1 having formed semiconductor devices. Contact holes 3 and interconnect trenches 4 for interconnect recesses are formed in the insulating film 2 by the lithography/etching technique. Thereafter, a barrier layer 5 of TaN or the like is formed on the insulating film 2, and a seed layer 6 as an electric supply layer for electroplating is formed on the barrier layer 5 by sputtering or the like.

Then, as shown in FIG. 1B, copper plating is performed onto the surface of the substrate W to fill the contact holes 3 and the interconnect trenches 4 of the substrate W with copper and, at the same time, deposit a copper film 7 on the insulating film 2. Thereafter, the barrier layer 5, the seed layer 6 and the copper film 7 on the insulating film 2 are removed by chemical-mechanical polishing (CMP) so as to make the surface of the copper film 7 filled in the contact holes 3 and the interconnect trenches 4, and the surface of the insulating film 2 lie substantially on the same plane. Interconnects (copper interconnects) 8 composed of the seed layer 6 and the copper film 7, as shown in FIG. 1C, is thus formed in the insulating film 2.

Then, as shown in FIG. 1D, electroless plating is performed onto the surface of the substrate W to form a protective film 9 of a Co alloy, a Ni alloy or the like on the surfaces of interconnects 8 selectively, thereby covering and protecting the surfaces of interconnects 8 with the protective film 9.

However, according to the conventional process for selectively covering and protecting the exposed surfaces of interconnects with a protective film, the protective film protrudes from the surface of an insulating film whereby the surface loses its flatness. When second-level interconnects are formed on first-level interconnects in the production of a multi-level interconnect structure, irregularities reflecting the shape of a protective film are produced on the surface of an interlevel insulating film deposited on the surface of the first-level interconnects, and the irregularities of the surface of the interlevel insulating film affect the processing accuracy in later etching, light exposure or the like processing for the formation of interconnect recesses. Further, unless the film thickness of the selectively formed protective film is controlled optimally, there may occur a case where adjacent protective films are too close to each other, and trouble, such as dissolution of the protective film or a barrier layer, can occur. This may result in generation of a leakage current that can lower the electrical properties of interconnects.

SUMMARY OF THE INVENTION

The present invention has been made in view of the above situation in the related art. It is therefore an object of the present invention to provide an interconnects-forming method and an interconnects-forming apparatus which can minimize the lowering of processing accuracy in etching, light exposure or the like processing for the formation of interconnect recesses in the production of multi-level interconnects, can improve the electromigration resistance of interconnects without impairing the electrical properties of the interconnects, and can enhance the reliability of the device.

In order to achieve the above object, the present invention provides an interconnects-forming method, comprising: providing interconnect recesses in an insulating film formed in a surface of a substrate; embedding an interconnect material in the interconnect recesses while forming a metal film of the interconnect material on a surface of the insulating film; removing an extra metal material other than the metal material in the interconnect recesses and flattening the substrate surface, thereby forming interconnects; forming a first protective film of a conductive material selectively on exposed surfaces of the interconnects; forming a second protective film on the surface of the substrate having the thus-formed first protective film; forming an interlevel insulating film on the surface of the substrate having the thus-formed second protective film; and flattening a surface of the interlevel insulating film.

Flattening the surface of the interlevel insulating film can minimize the lowering of processing accuracy in later etching, light exposure or the like processing for the formation of interconnect recesses in the interlevel insulating film.

In a preferred embodiment of the present invention, interconnect recesses are provided in the interlevel insulating film, and an interconnect material is embedded in the interconnect recesses to make a multi-level interconnect structure. A highly-integrated VLSI can be produced according to this embodiment.

The flattening of the surface of the interlevel insulating film is carried out, for example, by chemical-mechanical polishing, wet etching with a chemical, or heat reflowing.

The first protective film is composed of, for example, Co, a Co alloy, Ni, a Ni alloy, Mo, a Mo alloy, Ta, a Ta alloy, Ta nitride, WN, ZrN, Ti, a Ti alloy or Ti nitride.

The second protective film is composed of, for example, $Si_xN_y$, SiC, SiCN, SiCO or a borazine-silicon polymer.

Preferably, after the formation of interconnects by removing the extra metal material other than the metal material in the interconnect recesses and flattening the substrate surface, recesses for protective film are formed at the top portions of interconnects.

By forming the recesses for protective film at the top portions of interconnects and forming the first protective film selectively in the recesses for protective film to completely fill the recesses with the first protective film, it becomes possible to ensure a sufficient film thickness for the first protective film.

The recesses for protective film are formed, for example, by chemical-mechanical polishing, electrolytic polishing, dry etching with a plasma or wet etching with a chemical.

The depth of the recesses for protective film is preferably from 5 to 50 nm. This can minimize a rise in the resistance of interconnects.

The film thickness of the first protective film is preferably from 5 to 65 nm. This can optimize the height of the interconnects, whose surface is covered with the first protective film, protruding from the insulating film (interlevel insulating film).

The first protective film is preferably formed by electroless plating. This makes it possible to form a high-quality alloy film with good selectivity on the exposed interconnects.

Preferably, in advance of the electroless plating, a metal ion-containing catalyst is applied to the exposed surfaces of the interconnects. The application of a metal ion-containing catalyst to the surfaces of the interconnects enables the formation of a continuous uniform alloy film.

The film-forming rate in the electroless plating is preferably from 3 to 18 nm/min. If the film-forming rate is too high, the quality of the plated film is poor and, in addition, control of the film thickness is difficult. If the plating rate is too low, on the other hand, the consequent drop in the production throughput adversely affects the production cost. It is therefore preferred to control the processing conditions so as to attain the optimum film-forming rate of 3 to 18 nm/min.

The first protective film may have a protruding portion which protrudes from the surface of the insulating film.

Preferably, the height of the protruding portion of the first protective film from the surface plane of the insulating film is approximately equal to the film thickness of a barrier layer which has been formed on the surface of the interconnect recesses prior to the formation of the metal film.

A barrier layer, in general, is formed of Ta or TaN. Accordingly, when forming the first protective film by electroless plating, for example, the electroless plated film does not deposit on such a barrier layer. The electroless plated film, however, deposits (grows) isotropically. Thus, the first protective film grows not only in the height direction but also in the lateral direction. Accordingly, if the film thickness of the first protective film (plated film) is made too thick, it is highly likely that because of the lateral growth, adjacent first protective films (electroless plated films), formed on adjacent interconnects, come close to each other, leading to generation of a leakage current. If the film thickness of the electroless plated film is smaller than the film thickness of the barrier layer, on the other hand, the exposed end surface of the barrier layer cannot be fully covered with the first protective film; (i.e. the end surface remains partly exposed). There is, therefore, a likelihood that when the substrate is immersed in, for example, a liquid chemical or pure water, a large electrode potential difference is produced between the exposed barrier layer and the first protective film whereby due to the local cell effect, the metal can be dissolved in the liquid. When the metal is dissolved in the liquid, upon a post-treatment after the formation of the first protective film, for example, dissolved metal ions can remain on the insulating film between the interconnects, which could cause a leakage current between the interconnects.

In view of the above, the height of the protruding portion of the first protective film from the surface plane of the insulating film is set to be approximately equal to the film thickness of the barrier layer which has been formed on the surface of the interconnect recesses prior to the formation of the metal film. This makes it possible to fully cover the exposed surface of the barrier layer with the first protective film without the lateral extension of the protective film, thus obviating the above drawbacks and providing the first protective film with the optimum electrical properties.

The present invention also provides another interconnects-forming method, comprising: providing interconnect recesses in an insulating film formed in a surface of a substrate; embedding an interconnect material in the interconnect recesses while forming a metal film of the interconnect material on a surface of the insulating film; removing an extra metal material other than the metal material in the interconnect recesses and flattening the substrate surface, thereby forming interconnects; forming a first protective film of a conductive material selectively on exposed surfaces of the interconnects; forming a second protective film on the surface of the substrate having the thus-formed first protective film; flattening a surface of the second protective film; and forming an interlevel insulating film on the flattened surface of the second protective film.

Also by flattening the surface of the second protective film, the surface of the interlevel insulating film deposited thereon can be flattened, minimizing the lowering of processing accuracy in later etching, light exposure or the like processing for the formation of interconnect recesses in the interlevel insulating film.

The flattening of the surface of the second protective film is carried out, for example, by chemical-mechanical polishing or heat reflowing.

The present invention also provides still another interconnects-forming method, comprising: providing interconnect recesses in an insulating film formed in a surface of a substrate; embedding an interconnect material in the interconnect recesses while forming a metal film of the interconnect material on a surface of the insulating film; removing an extra metal material other than the metal material in the interconnect recesses and flattening the substrate surface, thereby forming interconnects; forming a first protective film of a conductive material selectively on exposed surfaces of the interconnects; forming an interlevel insulating film on the surface of the substrate having the thus-formed first protective film; and flattening a surface of the inter level insulating film.

There is a case where the interlevel insulating film is deposited directly on the surface of the substrate having the first protective film, without forming the second protective film. Also in such a case, flattening of the surface of the interlevel insulating film can minimize the lowering of processing accuracy in later etching, light exposure or the like processing for the formation of interconnect recesses in the interlevel insulating film.

The present invention also provides an interconnects-forming apparatus, comprising: an interconnects-forming unit for embedding an interconnect material in interconnect recesses provided in an insulating film formed in a surface of a substrate while forming a metal film of the interconnect material on a surface of the insulating film; a first flattening unit for removing an extra metal material other than the metal material in the interconnect recesses and flattening the substrate surface, thereby forming interconnects; a first protective film-forming unit for forming a first protective film of a conductive material selectively on exposed surfaces of the interconnects; a second protective film-forming unit for forming a second protective film on the surface of the substrate having the thus-formed first protective film; an inter level insulating film-forming unit for forming an interlevel insulating film on the surface of the substrate having the thus-formed second protective film; and a second flattening unit for flattening a surface of the interlevel insulating film.

The first protective film-forming unit is preferably comprised of an electroless plating unit comprising a plating tank, a substrate holding mechanism, an automatic substrate transport mechanism, a plating solution circulation mechanism, a plating solution temperature control mechanism, and a liquid control mechanism having a plating solution analysis/replenishment function.

Preferably, the electroless plating unit has at least one of a catalyst application treatment function, a pre-and/or post-catalyst application chemical cleaning function, a plating function, a post-plating chemical cleaning function, a post-chemical cleaning rinsing function and a substrate drying function.

The interconnects-forming apparatus may further comprise a recess processing unit which, after the formation of interconnects by removing the extra metal material other than the metal material in the interconnect recesses and flattening the substrate surface, forms recesses for protective film at the top portions of the interconnects.

The present invention also provides another interconnects-forming apparatus, comprising: an interconnects-forming unit for embedding an interconnect material in interconnect recesses provided in an insulating film formed in a surface of a substrate while forming a metal film of the interconnect material on a surface of the insulating film; a first flattening unit for removing an extra metal material other than the metal material in the interconnect recesses and flattening the substrate surface, thereby forming interconnects; a first protective film-forming unit for forming a first protective film of a conductive material selectively on exposed surfaces of the interconnects; a second protective film-forming unit for forming a second protective film on the surface of the substrate having the thus-formed first protective film; a second flattening unit for flattening a surface of the second protective film; and an interlevel insulating film-forming unit for forming an interlevel insulating film on the flattened surface of the second protective film.

The present invention also provides still another interconnects-forming apparatus, comprising: an interconnects-forming unit for embedding an interconnect material in interconnect recesses provided in an insulating film formed in a surface of a substrate while forming a metal film of the interconnect material on a surface of the insulating film; a first flattening unit for removing an extra metal material other than the metal material in the interconnect recesses and flattening the substrate surface, thereby forming interconnects; a first protective film-forming unit for forming a first protective film of a conductive material selectively on exposed surfaces of the interconnects; an interlevel insulating film-forming unit for forming an interlevel insulating film on the surface of the substrate having the thus-formed first protective film; and a second flattening unit for flattening a surface of the interlevel insulating film.

DETAILED DESCRIPTION OF THE PREFERRED EMBODIMENTS

Preferred embodiments of the present invention will now be described with reference to the drawings. The embodiments illustrate the case of forming interconnect recesses, such as interconnect trenches, in a surface of a substrate, such as a semiconductor wafer, and embedding copper as an interconnect material in the interconnect recesses to form interconnects of copper.

Figure 1A:
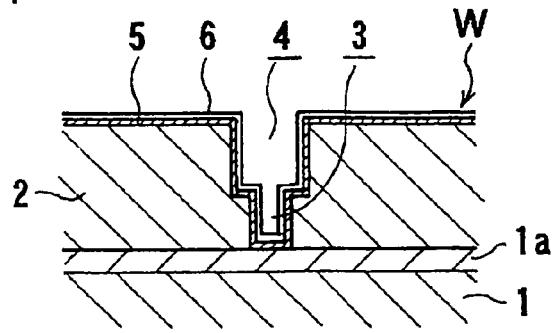
FIGS. 1A through 1D are diagrams illustrating, in sequence of process steps, a conventional process for forming interconnects in a semiconductor device.
Figure 1B:
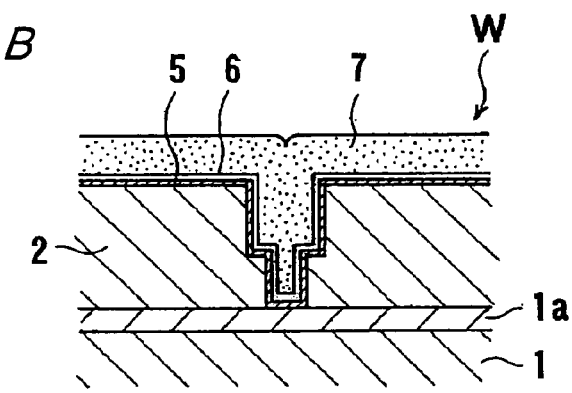
Figure 1C:
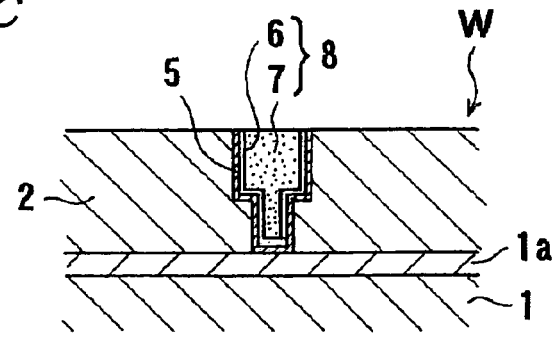
Figure 1D:
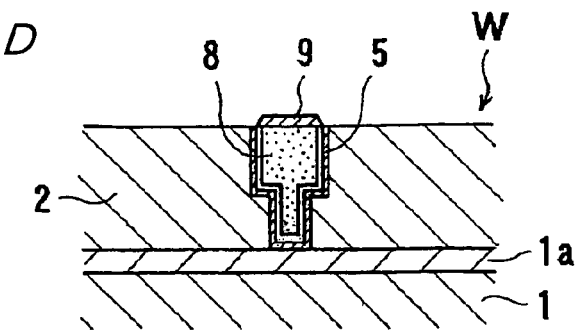
Figure 2:
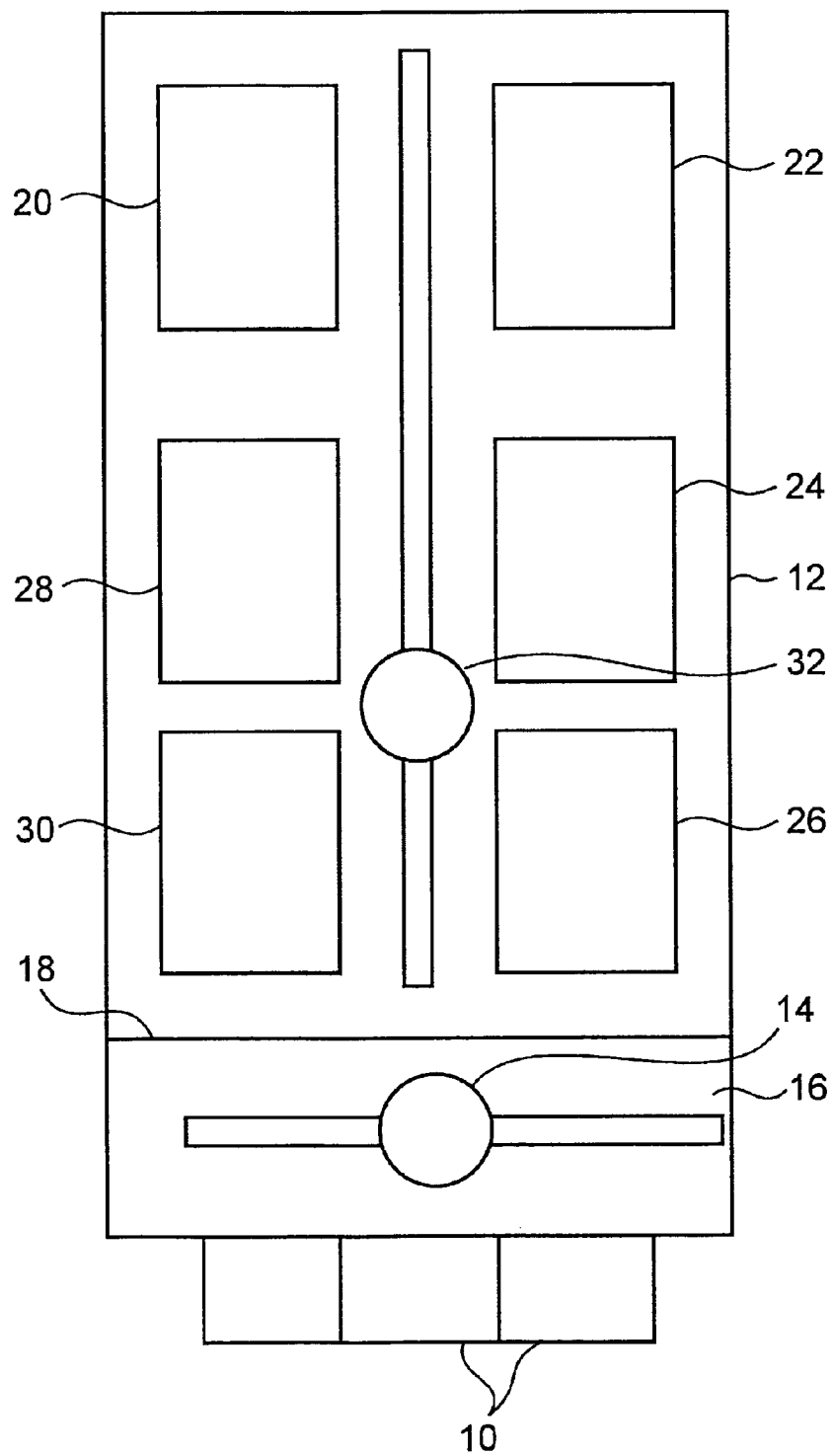
FIG. 2 is a plan view of an interconnects-forming apparatus for use in an interconnects-forming method according to the present invention.

FIG. 2 shows a plan view of an interconnects-forming apparatus according to an embodiment of the present invention. As shown in FIG. 2, the interconnects-forming apparatus includes a rectangular housing 12 and a transport box 10, such as a SMIF box or a FOUP, detachably mounted to the housing 12 and housing a number of substrates such as semiconductor wafers. A loading/unloading station 16, which is provided with a first transport robot 14 as a first transport device therein, is provided in the housing 12. Further, in that area within the housing 12 which is partitioned off from the loading/unloading station 16 by a partition 18, there are provided an interconnects-forming unit 20, a first protective film-forming unit 22, a second protective film-forming unit 24, an interlevel insulating film-forming unit 26, a first flattening unit 28 and a second flattening unit 30, which units are disposed on either side of a second transport robot 32 as a second transport device.

The housing 12 is made light-shielding so that the below-described processing steps can be carried out under light-shielded conditions in the housing 12; (i.e., without irradiation of light, such as illuminating light, onto interconnects). This can prevent corrosion of interconnects of e.g. copper due to a photopotential difference that would be produced by light irradiation onto the interconnects.

The interconnects-forming unit 20 is to embed copper as an interconnect material in interconnect recesses, such as interconnect trenches, provided in an insulating film formed in a surface of a substrate while forming a metal film of copper (copper film) on a surface of the insulating film, and is comprised of, for example, an electroplating unit, an electroless plating unit, a CVD unit or a PVD unit.

The first flattening unit 28 is to remove an extra metal material other than the metal material in the interconnect recesses and flatten the substrate surface, thereby forming interconnects, and is comprised of, for example, a chemical-mechanical polishing (CMP) unit or an electrolytic polishing unit.

The first protective film-forming unit 22 is provided to form a first protective film of a conductive material selectively on exposed surfaces of interconnects, and is comprised of, for example, an electroless plating unit.

The electroless plating unit for forming the first protective film comprises at least a plating tank, a substrate holding mechanism, an automatic substrate transport mechanism, a plating solution circulation mechanism, a plating solution temperature control mechanism, and a liquid control mechanism having a plating solution analysis/replenishment function. This makes it possible to realize a stable electroless plating process automatically. Further, the electroless plating unit has at least one of a catalyst application treatment function, a pre-and/or post-catalyst application chemical cleaning function, a plating function, a post-plating chemical cleaning function, a post-chemical cleaning rinsing function and a substrate drying function. Such a unit can form a high-quality first protective film on the interconnects.

The second protective film-forming unit 24 is provided to form a second protective film on the surface of the substrate after the formation of the first protective film, and is comprised of, for example, a CVD unit, a PVD unit or a coating unit.

The interlevel insulating film-forming unit 26 is provided to form an interlevel insulating film on the surface of the substrate after the formation of the second protective film, and is comprised of, for example, a CVD unit or a coating unit.

The second flattening unit 30 is provided to flatten the surface of the interlevel insulating film, and is comprised of, for example, a chemical-mechanical polishing unit, a chemical wet etching unit or a heat reflowing unit.

Though in this embodiment the first flattening unit 28 and the second flattening unit 30 are provided separately, it is also possible to use, for example, one chemical-mechanical polishing unit or electrolytic polishing unit both as the first flattening unit 28 and as the second flattening unit 30.

An interconnects (copper interconnects)-forming method according to a first embodiment of the present invention will now be described by referring to FIGS. 3A through 6.

Figure 3A:
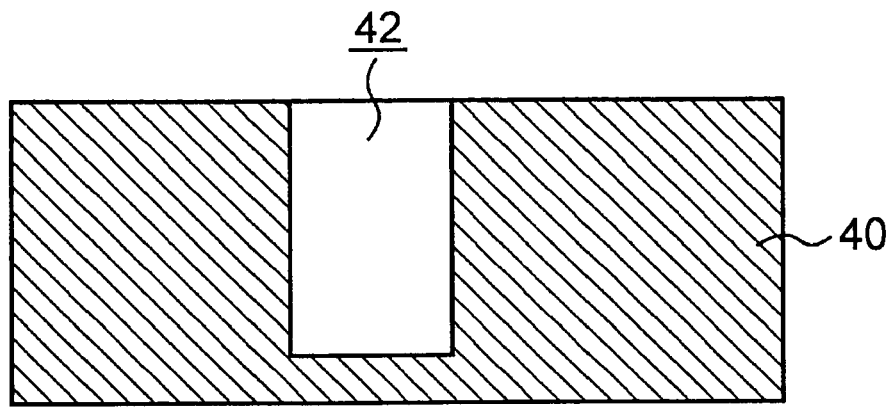
FIGS. 3A through 3C are diagrams illustrating, in sequence of process steps, an interconnects-forming method according to a first embodiment of the present invention, showing the process up to the formation of a seed layer.
Figure 3B:
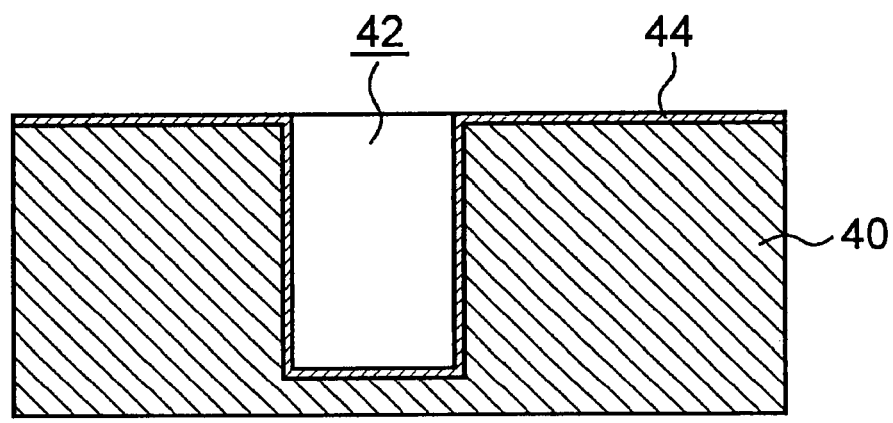
Figure 3C:
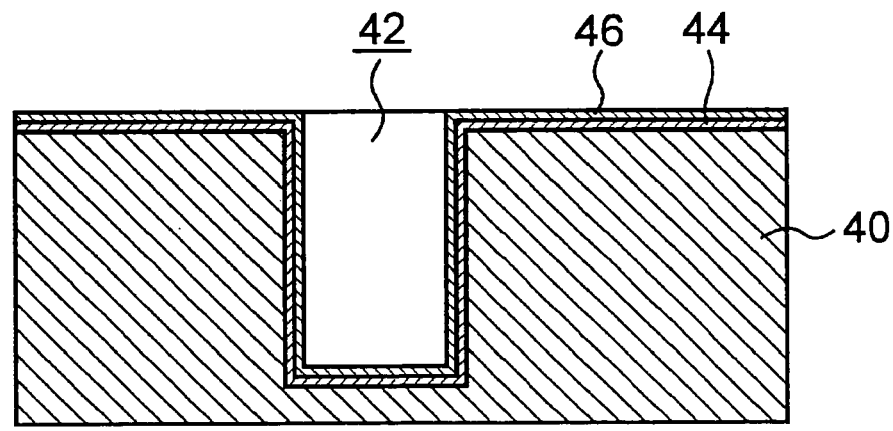

First, as shown in FIG. 3A, interconnect recesses such as interconnect trenches 42 are formed by, for example, the lithography/etching technique in an insulating film 40, such as an oxide film of $SiO_2$ or a film of low-k material, formed in a surface of a substrate (step 1). A barrier layer 44 of TaN or the like is formed on a surface of the insulating film 40, as shown in FIG. 3B (step 2), and a (copper) seed layer 46 as an electric supply layer is formed by, for example, sputtering on a surface of the barrier layer 44, as shown in FIG. 3C (step 3). The substrate having the thus-formed seed layer 46 is housed in the transport box 10, and the transport box 10 housing such substrates is transported to the housing 12 of the interconnects-forming apparatus and is mounted to the housing 12.

Next, the substrates are taken one by one by the first transport robot 14 out of the transport box 10 and are each carried in the loading/unloading station 16. Thereafter, the substrate is transported by the second transport robot 32 to the interconnects-forming unit 20.

Figure 4A:
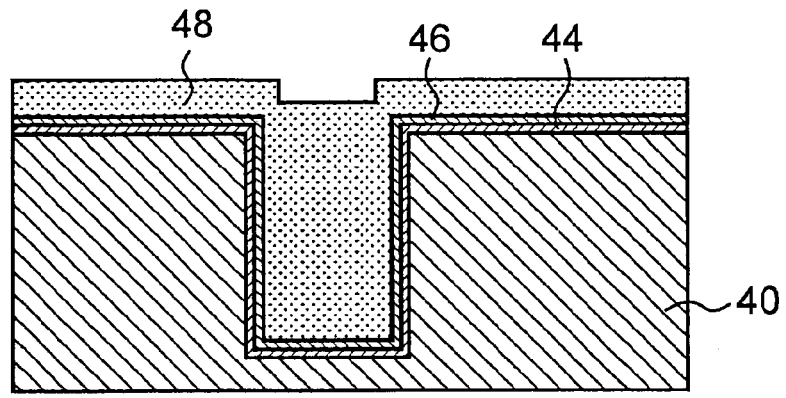
FIGS. 4A through 4C are diagrams illustrating, in sequence of process steps, the interconnects-forming method according to the first embodiment of the present invention, showing the process from the formation of a copper film to the formation of a first protective film.

In the interconnects-forming unit 20, as shown in FIG. 4A, the interconnect material (copper) is embedded in the interconnect trenches (interconnect recesses) 42 by, for example, electroplating or electroless plating while forming a metal film (copper film) 48 of copper on a surface of the seed layer 46 (step 4).

Figure 4B:
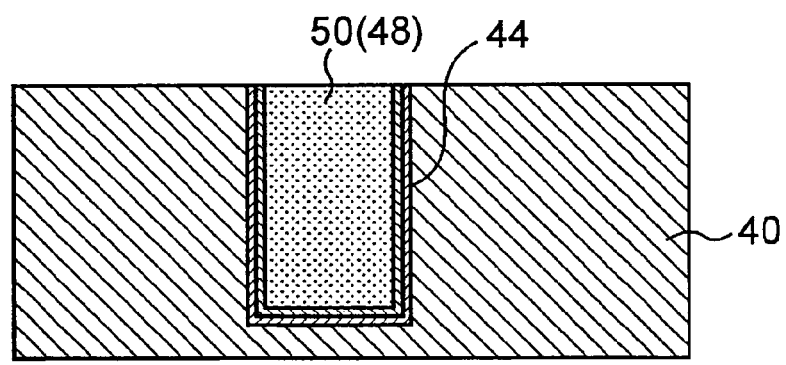

The substrate having the copper film 48 formed in the surface is transported by the second transport robot 32 to the first flattening unit 28. In the first flattening unit 28, as shown in FIG. 4B, the extra metal material other than the metal material in the interconnect trenches 42 (i.e., the copper film 48, the seed layer 46, and the barrier layer 44 on the insulating film 40) is removed and the substrate surface is flattened by, for example, chemical-mechanical polishing (CMP) or electrolytic polishing, thereby forming interconnects 50 composed of the copper film 48 (step 5).

Figure 4C:
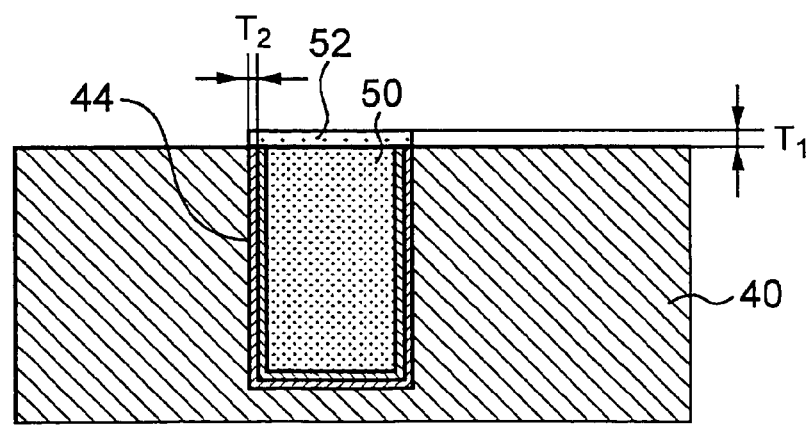

Next, the substrate after the formation of interconnects 50 by the surface flattening is transported by the second transport robot 32 to the first protective film-forming unit 22. In the first protective film-forming unit 22, as shown in FIG. 4C, a first protective film 52 of a conductive material, such as Co, a Co alloy, Ni, a Ni alloy, Mo, a Mo alloy, Ta, a Ta alloy, Ta nitride, WN, ZrN, Ti, a Ti alloy or Ti nitride, is formed selectively on exposed surfaces of the interconnects 50 by, for example, electroless plating (step 6).

The use of electroless plating makes it possible to form a high-quality first protective film 52 of e.g. an alloy with good selectivity on the exposed surfaces of the interconnects 50. It is preferred that in advance of the electroless plating, a metal ion-containing catalyst be applied to the exposed surfaces of the interconnects. The application of a metal ion-containing catalyst to the surfaces of the interconnects enables the formation of a continuous uniform first protective film 52 of e.g. an alloy.

The film-forming rate in the electroless plating is preferably from 3 to 18 nm/min. If the film-forming rate is too high, the quality of the plated film is poor and, in addition, control of the film thickness is difficult. If the plating rate is too low, on the other hand, the consequent drop in the production throughput adversely affects the production cost. It is therefore preferred to control the processing conditions so as to attain the optimum film-forming rate of 3 to 18nm/min. It is preferred that the film thickness T1 of the first protective film 52 formed on the surfaces of the interconnects 50 be approximately equal to the film thickness T2 of the barrier layer 44 formed on the surfaces of the interconnect trenches 42 (T1?T2). This can produce the first protective film 52 having optimum electrical properties. It is to be noted in this regard that the barrier layer 44, in general, is formed of Ta or TaN. Accordingly, when forming the first protective film 52 by electroless plating, for example, the electroless plated film does not deposit on such a barrier layer 44. The electroless plated film, however, deposits (grows) isotropically. Thus, the first protective film 52 grows not only in the height direction but also in the lateral direction. Accordingly, if the film thickness of the first protective film 52 (plated film) is made too thick, it is highly likely that because of the lateral growth, adjacent first protective films 52, formed on adjacent interconnects 50, come close to each other, leading to generation of a leakage current. If the film thickness of the first protective film 52 is smaller than the thickness of the barrier layer 44, on the other hand, the exposed end surface of the barrier layer 44 cannot be fully covered with the first protective film 52 (i.e., the end surface remains partly exposed). There is, therefore, a likelihood that when the substrate is immersed in, for example, a liquid chemical or pure water, a large electrode potential difference is produced between the exposed barrier layer 44 and the first protective film 52 whereby due to the local cell effect, the metal can be dissolved in the liquid. When the metal is dissolved in the liquid, upon a post-treatment after the formation of the first protective film 52, for example, dissolved metal ions can remain on the insulating film 40 between the interconnects 50, which could cause a leakage current between the interconnects 50.

In view of the above, the film thickness $T_1$ of the first protective film 52 (i.e., the height of the first protective film 52 protruding from the surface plane of the insulating film 40) is set to be approximately equal to the film thickness $T_2$ of the barrier layer 44 formed on the surfaces of the interconnect trenches 42. This makes it possible to fully cover the exposed surface of the barrier layer 44 with the first protective film 52 without the lateral extension of the protective film 52, thus obviating the above drawbacks and providing the first protective film 52 with the optimum electrical properties.

Figure 5A:
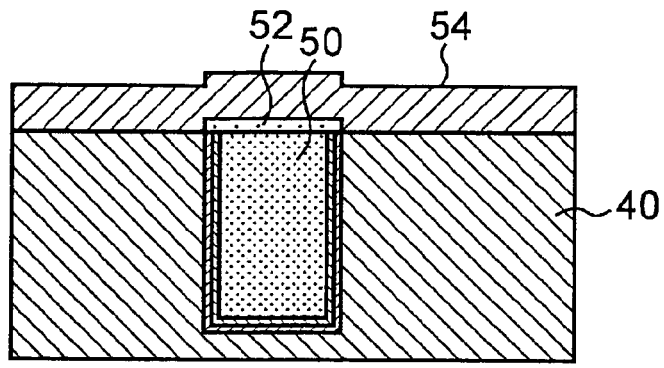
FIGS. 5A through 5C are diagrams illustrating, in sequence of process steps, the interconnects-forming method according to the first embodiment of the present invention, showing the process from the formation of a second protective film.

Next, the substrate having the thus-formed first protective film 52 is transported by the second transport robot 32 to the second protective film-forming unit 24. In the second protective film-forming unit 24, as shown in FIG. 5A, a second protective film 54 as a hard mask or an etch step layer composed of, for example, $Si_xN_y$, SiC, SiCN or a borazine-silicon polymer is formed on the surface of the substrate by, for example, CVD, PVD or coating (step 7).

Figure 5B:
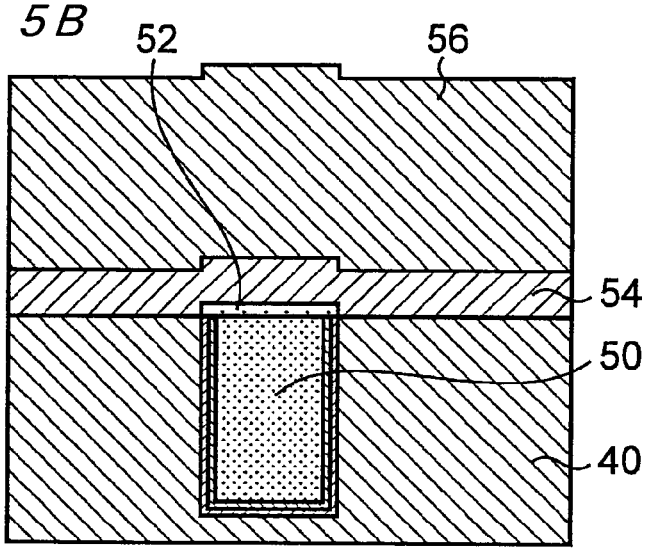

The substrate having the thus-formed second protective film 54 is transported by the second transport robot 32 to the interlevel insulating film-forming unit 26. In the interlevel insulating film-forming unit 26, as shown in FIG. 5B, an interlevel insulating film 56 is formed on the surface of the substrate by, for example, CVD or coating (step 8). When the interlevel insulating film 56 is thus formed, irregularities reflecting the shape of the first protective film 52 are produced on a surface of the interlevel insulating film 56, and the irregularities of the surface of the interlevel insulating film 56 affect the processing accuracy in later etching, light exposure or the like processing for the formation of interconnect recesses.

Figure 5C:
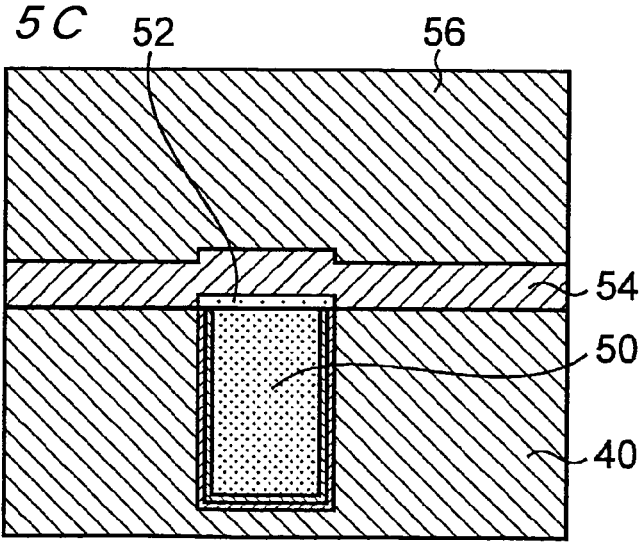
Figure 6:
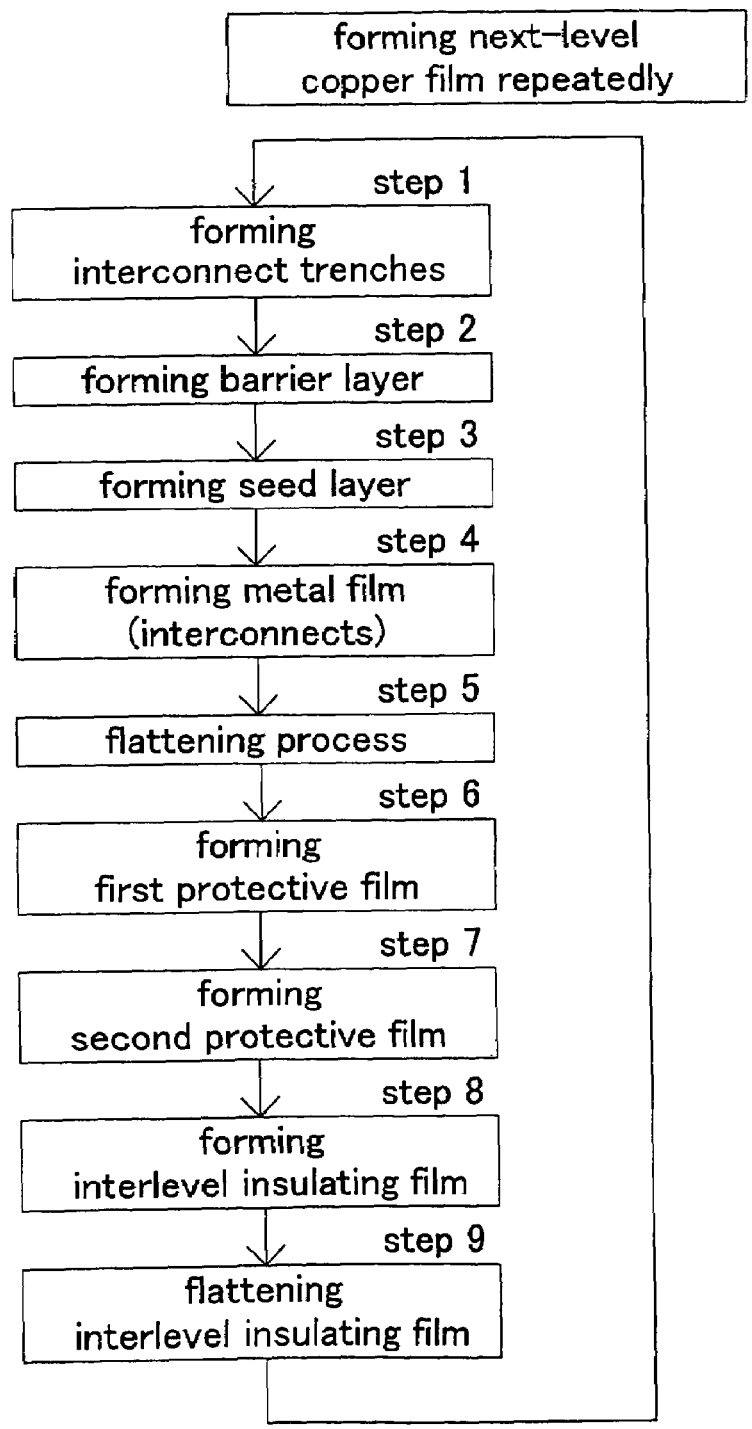
FIG. 6 is a block diagram showing the process steps of the film-forming method according to the first embodiment of the present invention.

Accordingly, the substrate having the thus-formed interlevel insulating film 56 is transported by the second transport robot 32 to the second flattening unit 30, where a surface of the interlevel insulating film 56 is flattened by, for example, chemical-mechanical polishing, wet etching with a chemical or heat reflowing, as shown in FIG. 5C (step 9).

The interlevel insulating film 56 is then subjected to the same process as described above (steps 1–9) to form a multi-level interconnect structure. This enables the production of a highly-integrated VLSI. The flattening of the surface of the interlevel insulating film 56 can minimize the lowering of processing accuracy in later etching, light exposure or the like processing for the formation of interconnect recesses in the interlevel insulating film 56.

Figure 7A:
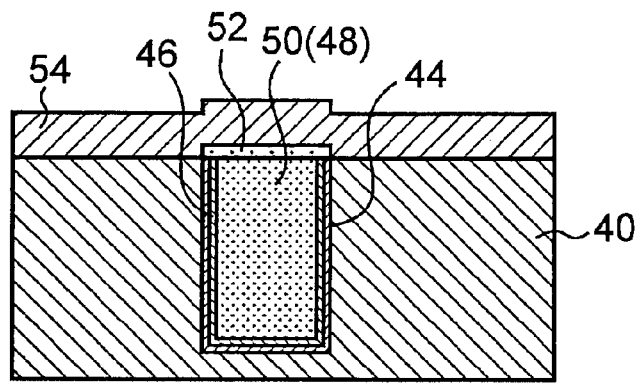
FIGS. 7A through 7C are diagrams illustrating, in sequence of process steps, an interconnects-forming method according to a second embodiment of the present invention, showing the process from the formation of a second protective film.
Figure 7B:
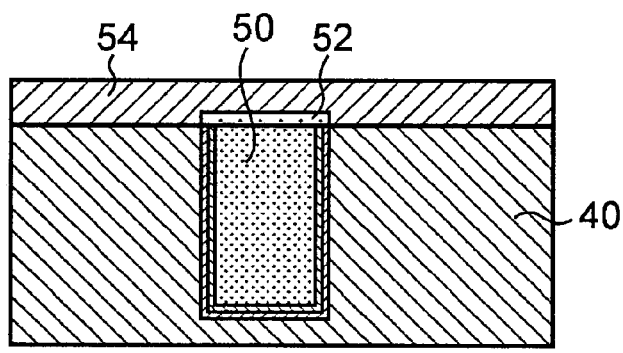
Figure 7C:
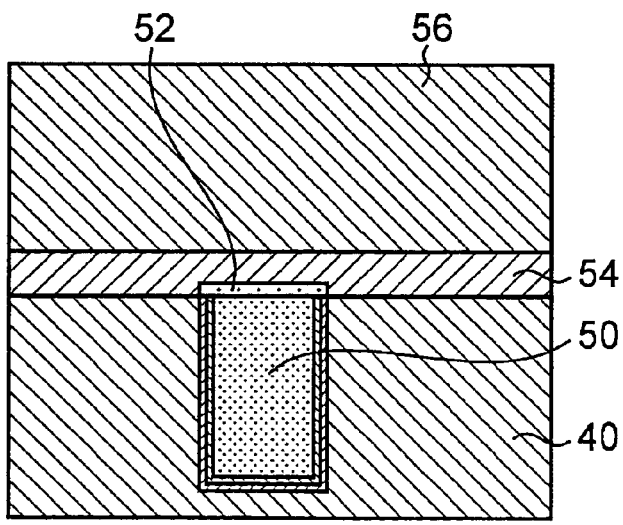
Figure 8:
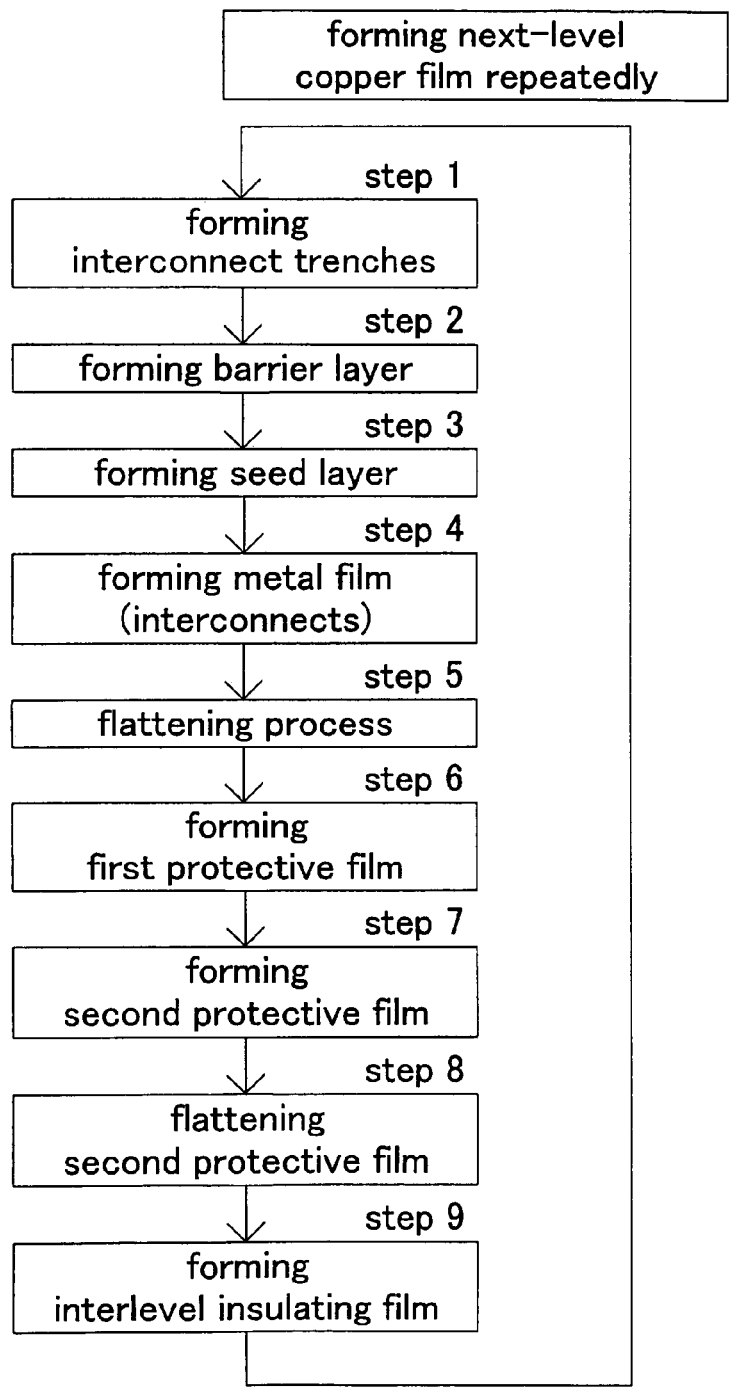
FIG. 8 is a block diagram showing the process steps of the film-forming method according to the second embodiment of the present invention.

FIGS. 7A through 8 illustrate an interconnects-forming method according to a second embodiment of the present invention. This embodiment differs from the above-described first embodiment in the respects described below. This embodiment employs as the second flattening unit 30 shown in FIG. 2 a unit, comprised of, for example, a chemical-mechanical polishing unit, an electrolytic polishing unit or a heat reflowing unit, for flattening the surface of the second protective film 54.

First, as with the first embodiment, interconnect trenches (interconnect recesses) 42 are formed in an insulating film 40 formed in a surface of a substrate, and a barrier layer 44 and a seed layer 46 are formed in this order on a surface of the insulating film 40. Further, a metal film (copper film) 48 of copper is formed on a surface of the seed layer 46. Thereafter, an extra metal material other than the metal material in the interconnect trenches 42 is removed and the substrate surface is flattened to thereby form interconnects 50 composed of the copper film 48, and then a first protective film 52 is formed selectively on exposed surfaces of the interconnects 50 (steps 1 to 6).

The substrate after the formation of the first protective film 52 is transported by the second transport robot 32 to the second protective film-forming unit 24, where a second protective film 54 is formed on the surface of the substrate, as shown in FIG. 7A (step 7). The substrate after the formation of the second protective film 54 is transported by the second transport robot 32 to the second flattening unit 30.

In the second flattening unit 30, as shown in FIG. 7B, a surface of the second protective film 54 is flattened by, for example, chemical-mechanical polishing, electrolytic polishing or heat reflowing (step 8).

The substrate after the flattening of the surface of the second protective film 54 is transported by the second transport robot 32 to the interlevel insulating film-forming unit 26, where an interlevel insulating film 56 is formed on the surface of the substrate, as shown in FIG. 7C (step 9). Since the surface of the second protective film 54 has been flattened in the preceding step, the interlevel insulating film 56 can have a flat surface.

Figure 9A:
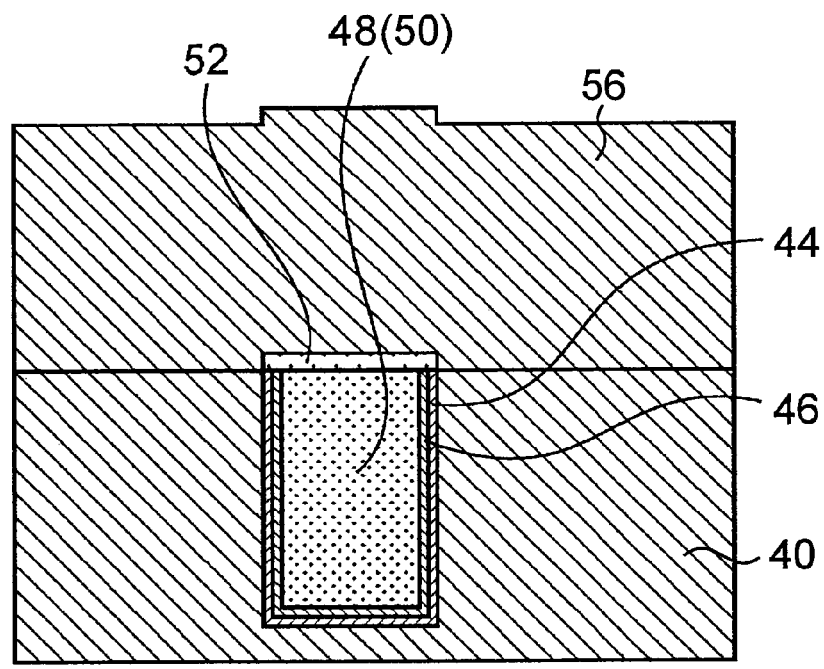
FIGS. 9A and 9B are diagrams illustrating, in sequence of process steps, an interconnects-forming method according to a third embodiment of the present invention, showing the process from the formation of an interlevel insulating film.
Figure 9B:
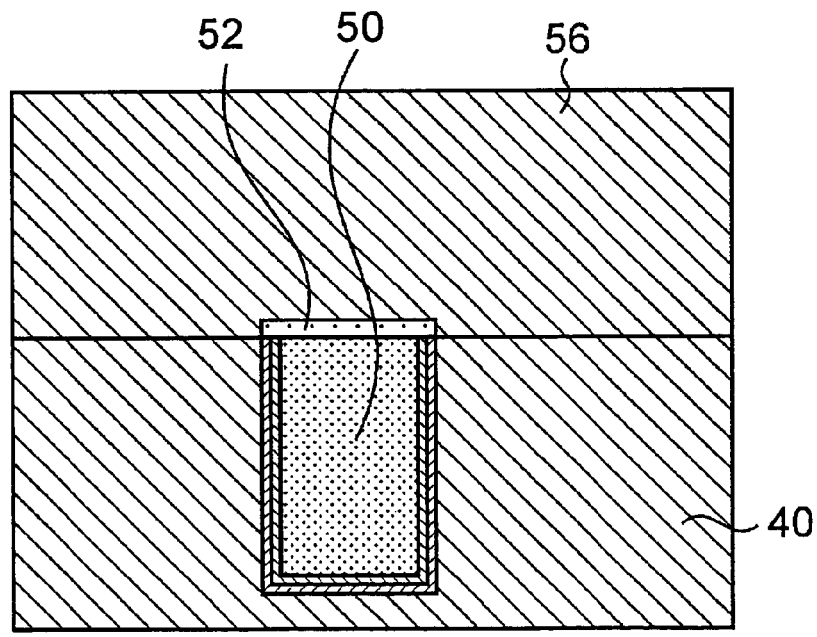
Figure 10:
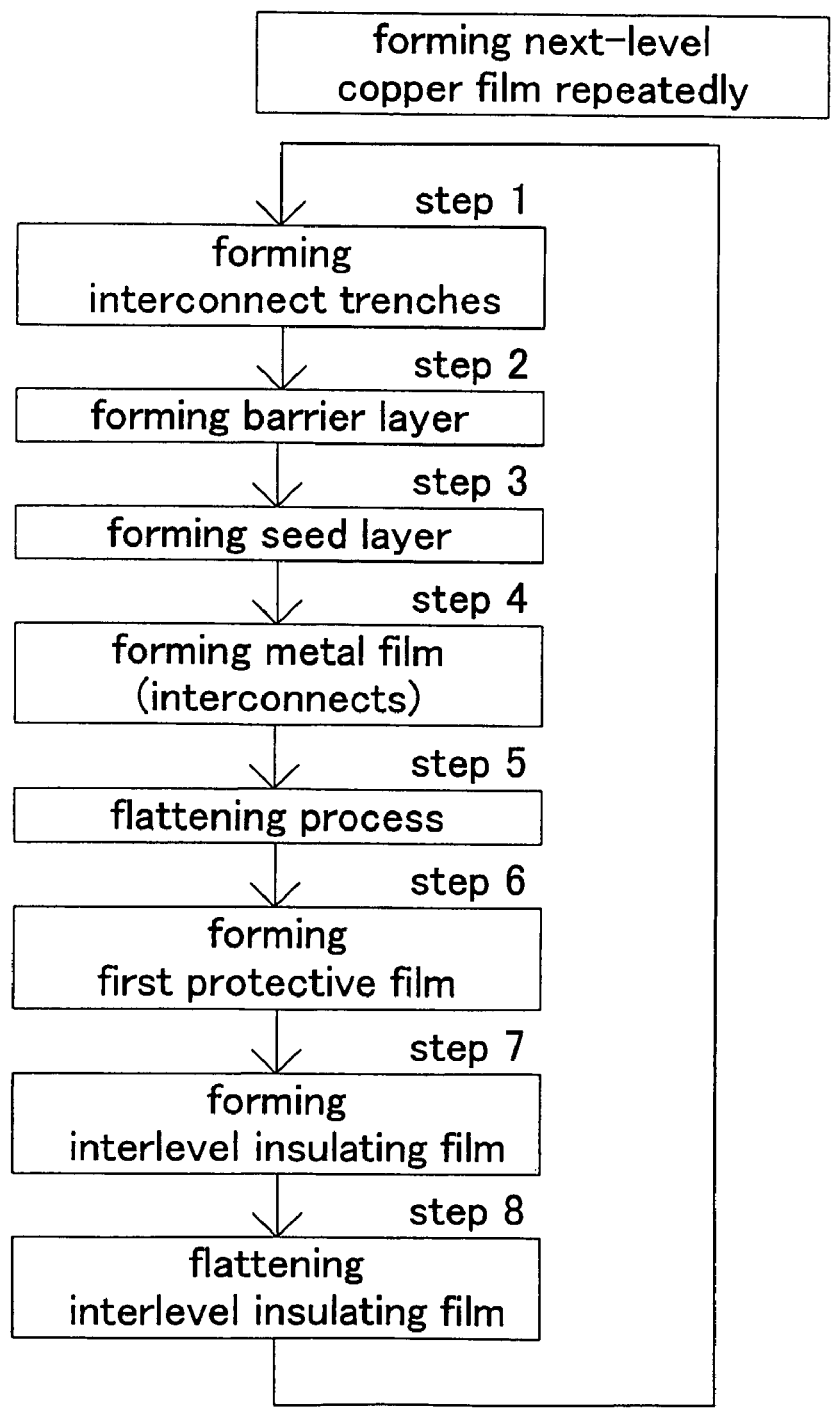
FIG. 10 is a block diagram showing the process steps of the film-forming method according to the third embodiment of the present invention.

FIGS. 9A through 10 illustrate an interconnects-forming method according to a third embodiment of the present invention. This embodiment differs from the above-described first embodiment in the respects described below. According to this embodiment, the second protective film-forming unit 24 shown in FIG. 2 is omitted.

First, as with the first embodiment, interconnect trenches (interconnect recesses) 42 are formed in an insulating film 40 formed in a surface of a substrate, and a barrier layer 44 and a seed layer 46 are formed in this order on a surface of the insulating film 40. Further, a metal film (copper film) 48 of copper is formed on a surface of the seed layer 46. Thereafter, an extra metal material other than the metal material in the interconnect trenches 42 is removed and the substrate surface is flattened to thereby form interconnects 50 composed of the copper film 48, and then a first protective film 52 is formed selectively on exposed surfaces of the interconnects 50 (steps 1 to 6).

The substrate after the formation of the first protective film 52 is transported by the second transport robot 32 to the interlevel insulating film-forming unit 26, where an interlevel insulating film 56 is formed on the surface of the substrate, as shown in FIG. 9A (step 7). Next, the substrate after the formation of the interlevel insulating film 56 is transported by the second transport robot 32 to the second flattening unit 30, where a surface of the interlevel insulating film 56 is flattened, as shown in FIG. 9B (step 8).

There is a case where the interlevel insulating film 56 is deposited directly on the surface of the substrate having the first protective film 52, without forming the second protective film 54. Also in such a case, flattening the surface of the interlevel insulating film 56 can minimize the lowering of processing accuracy in later etching, light exposure or the like processing for the formatting of interconnect recesses in the interlevel insulating film 56.

FIGS. 11A through 13 illustrate an interconnects-forming method according to a fourth embodiment of the present invention. This embodiment differs from the above-described first embodiment in the respects described below. This embodiment employs as the first flattening unit 28 shown in FIG. 2, for example, a chemical-mechanical polishing unit or an electrolytic processing unit, and utilizes the chemical-mechanical polishing unit or the electrolytic polishing unit also as a recess processing unit. Instead of the chemical-mechanical polishing unit or the electrolytic polishing unit, it is also possible to employ a dry etching unit using a plasma or a wet etching unit using a liquid chemical as a recess processing unit. Such a unit may be provided exclusively for recess processing. This holds also for the embodiments described later.

First, as with the first embodiment, interconnect trenches (interconnect recesses) 42 are formed in an insulating film 40 formed in a surface of a substrate, and a barrier layer 44 and a seed layer 46 are formed in this order on the surface of the insulating film 40. A metal film (copper film) 48 of copper is then formed on a surface of the seed layer 46 (steps 1 to 5).

Figure 11A:
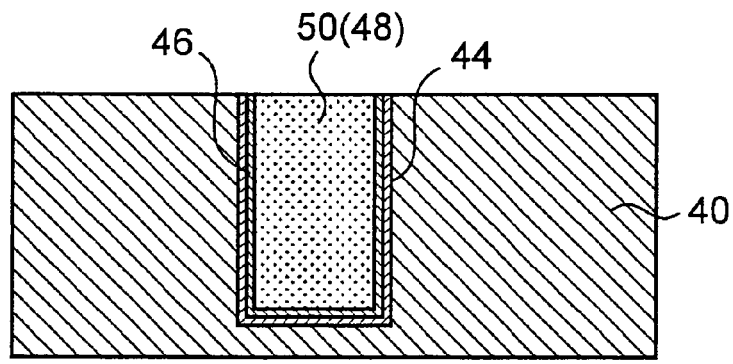
FIGS. 11A through 11C are diagrams illustrating, in sequence of process steps, an interconnects-forming method according to a fourth embodiment of the present invention, showing the process from the flattening of substrate surface to the formation of a first protective film.
Figure 11B:
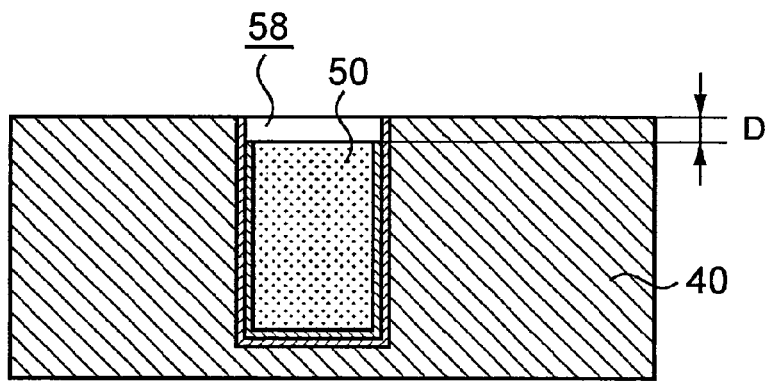

The substrate having the metal film 48 formed in the surface is transported by the second transport robot 32 to the first flattening unit 28. In the first flattening unit 28, as shown in FIG. 11A, an extra metal material other than the metal material in the interconnect trenches 42 (i.e., the copper film 48, the seed layer 46, and the barrier layer 44 on the insulating film 40) is removed, and the substrate surface is flattened by, for example, chemical-mechanical polishing (CMP) or electrolytic polishing, thereby forming interconnects 50 composed of the copper film 48 (step 5). Subsequently, interconnect recess processing is carried out in the first flattening unit 28. In particular, as shown in FIG. 11B, the top portions of the interconnects 50 are removed, thereby forming recesses 58 for protective film having a depth D of e.g. 5 to 50 nm (step 6).

Figure 11C:
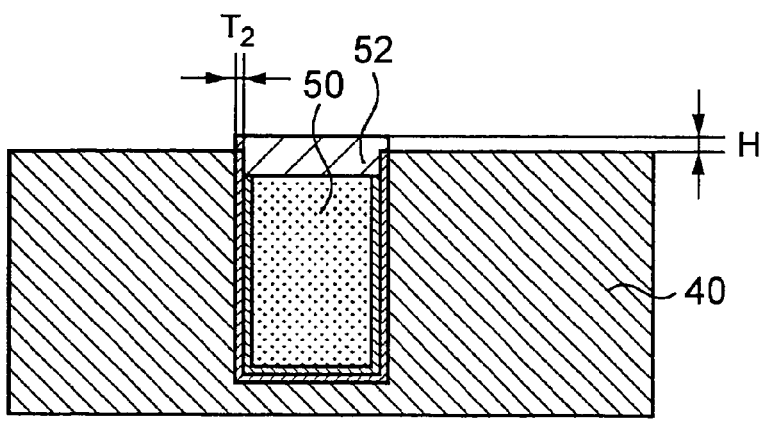

Next, the substrate having the thus-formed recesses 58 for protective film is transported by the second transport robot 32 to the first protective film-forming unit 22. In the first protective film-forming unit 22, as shown in FIG. 11C, a first protective film 52 of a conductive material is formed selectively on exposed surfaces of the interconnects 50 by, for example, electroless plating, thereby filling the recesses 58 for protective film with the first protective film 52 (step 7). By thus setting the depth D of the recesses 58 to form a protective film with a thickness of 5 to 20 nm and filling the recesses 58 with the first protective film 52, the first protective film 52 having a sufficient film thickness can be formed while suppressing a rise in the resistance of the interconnects 50.

As with the preceding embodiments, the first protective film 52 is made to protrude from the surface plane of the insulating film 40 such that the height H of the protruding portion of the first protective film 52 is approximately equal to the film thickness $T_2$ of the barrier layer 44 formed on the surfaces of the interconnect recesses 42 ($H \approx T_2$). This can produce the first protective film 52 having an optimum film thickness with respect to electrical properties.

The film thickness of the first protective film 52 is preferably made e.g. 5 to 65 nm, depending upon the depth of the recesses 58 for protective film. This can optimize the height of the interconnects 50, whose surface is covered with the first protective film 52, protruding from the insulating film (interlevel insulating film) 40.

Figure 12A:
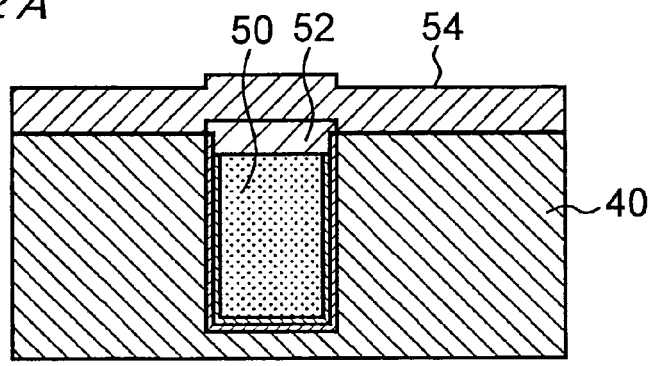
FIGS. 12A through 12C are diagrams illustrating, in sequence of process steps, the interconnects-forming method according to the fourth embodiment of the present invention, showing the process from the formation of a second protective film.

Next, the substrate having the thus-formed first protective film 52 is transported by the second transport robot 32 to the second protective film-forming unit 24. In the second protective film-forming unit 24, as shown in FIG. 12A, a second protective film 54 as a hard mask or an etch step layer is formed on the surface of the substrate by, for example, CVD, PVD or coating (step 8).

Figure 12B:
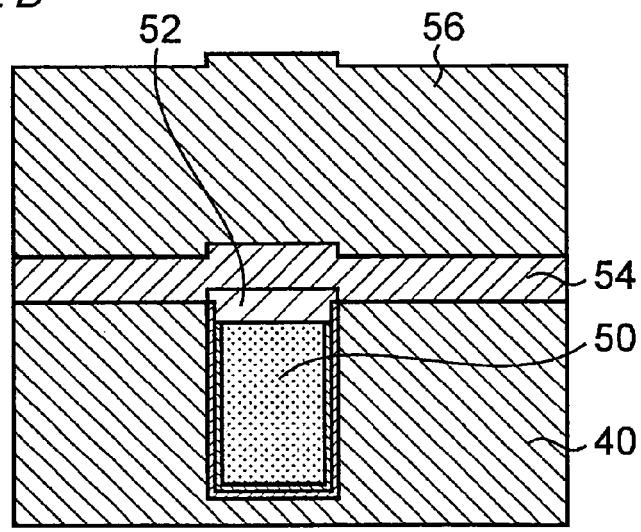

The substrate having the thus-formed second protective film 54 is transported by the second transport robot 32 to the interlevel insulating film-forming unit 26. In the interlevel insulating film-forming unit 26, as shown in FIG. 12B, an interlevel insulating film 56 is formed on the surface of the substrate by, for example, CVD or coating (step 9).

Figure 12C:
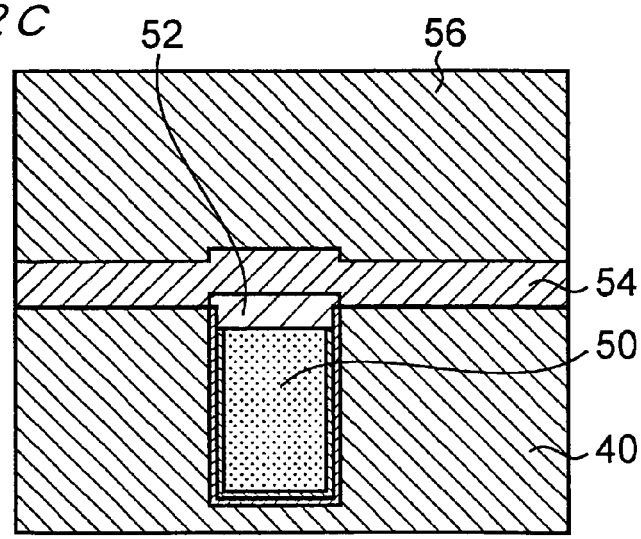
Figure 13:
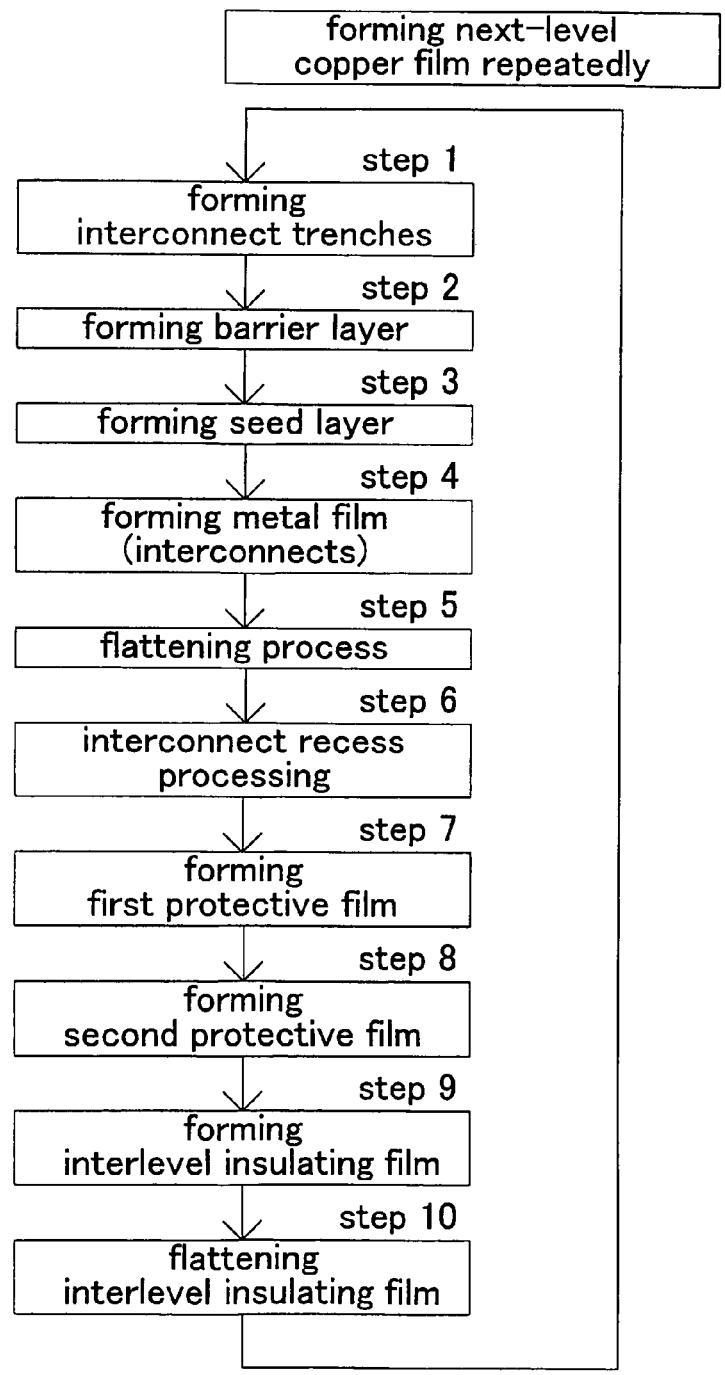
FIG. 13 is a block diagram showing the process steps of the film-forming method according to the fourth embodiment of the present invention.

Next, the substrate having the thus-formed interlevel insulating film 56 is transported by the second transport robot 32 to the second flattening unit 30, where a surface of the interlevel insulating film 56 is flattened by, for example, chemical-mechanical polishing, wet etching with a chemical or heat reflowing, as shown in FIG. 12C (step 10).

Figure 14A:
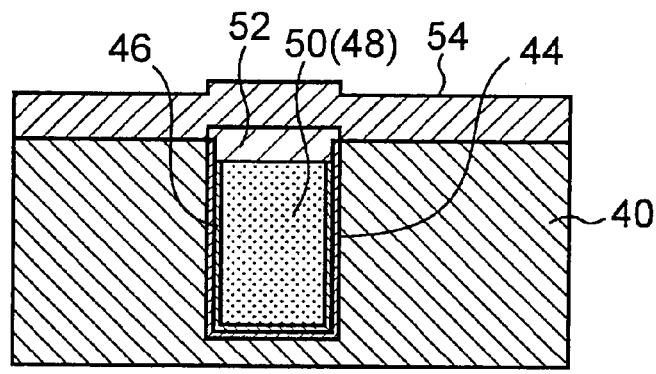
FIGS. 14A through 14C are diagrams illustrating, in sequence of process steps, an interconnects-forming method according to a fifth embodiment of the present invention, showing the process from the formation of a second protective film.
Figure 14B:
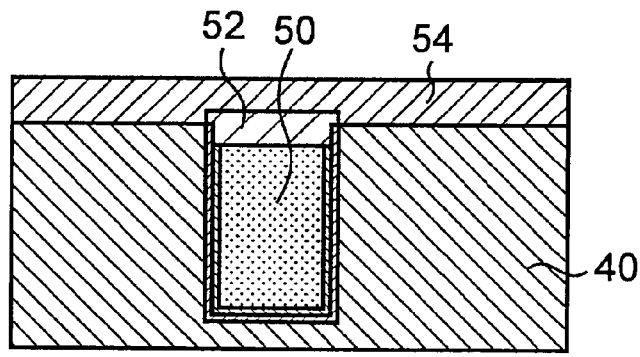
Figure 14C:
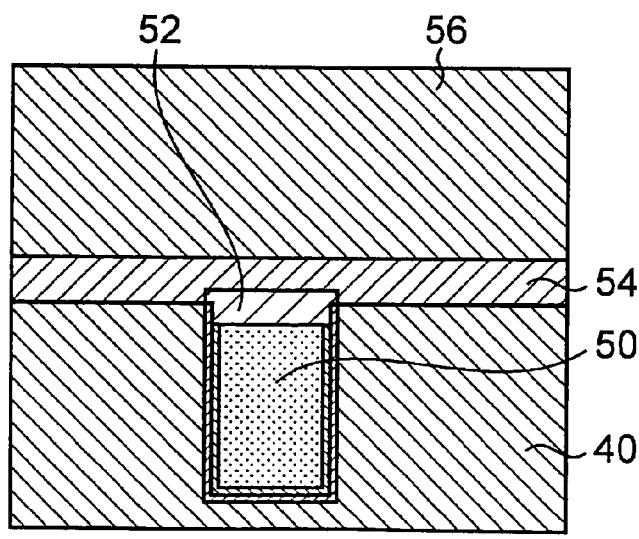
Figure 15:
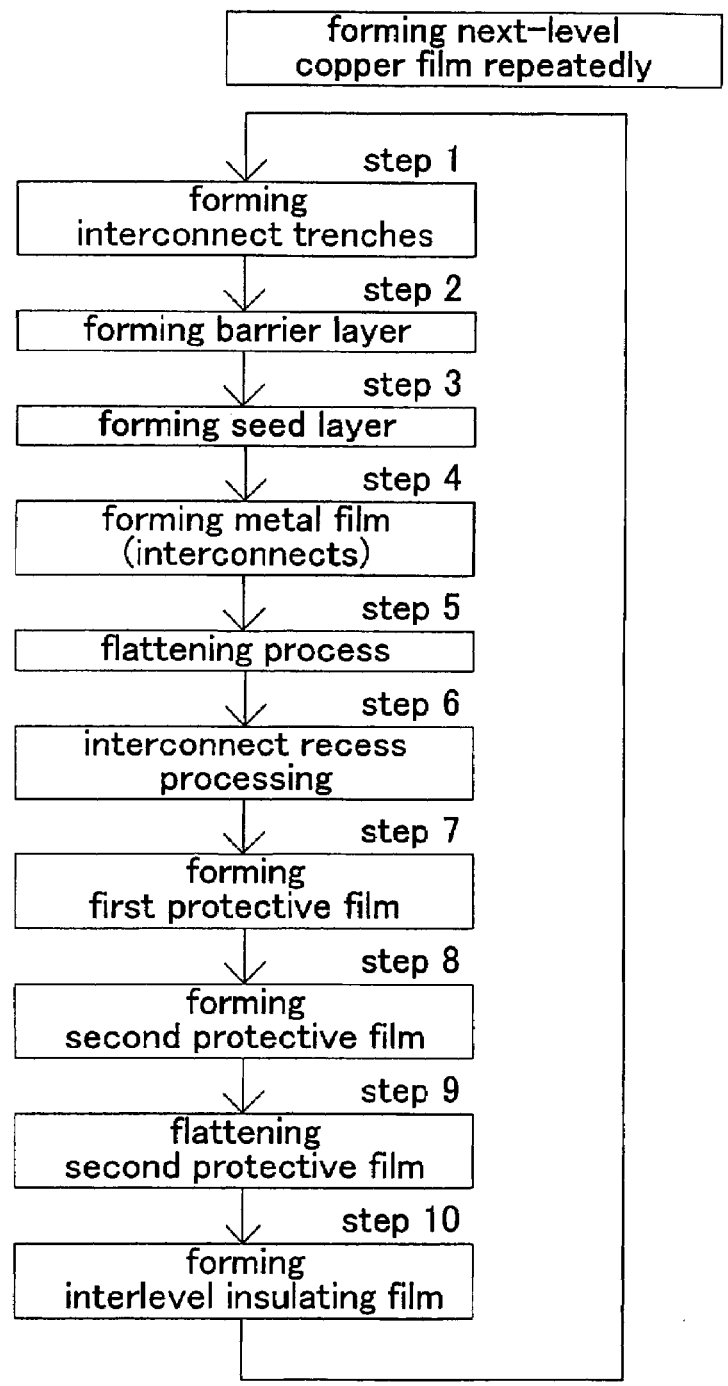
FIG. 15 is a block diagram showing the process steps of the film-forming method according to the fifth embodiment of the present invention.

FIGS. 14A through 15 illustrate an interconnects-forming method according to a fifth embodiment of the present invention. This embodiment differs from the above-described fourth embodiment in the respects described below. As with the above-described second embodiment, this embodiment employs as the second flattening unit 30 shown in FIG. 2 a unit, comprised of, for example, a chemical-mechanical polishing unit, an electrolytic polishing unit or a heat reflowing unit, for flattening the surface of the second protective film 54.

First, as with the fourth embodiment, interconnect trenches (interconnect recesses) 42 are formed in an insulating film 40 formed in a surface of a substrate, and a barrier layer 44 and a seed layer 46 are formed in this order on a surface of the insulating film 40. Further, a metal film (copper film) 48 of copper is formed on a surface of the seed layer 46. Thereafter, an extra metal material other than the metal material in the interconnect trenches 42 is removed and the substrate surface is flattened to thereby form interconnects 50 composed of the copper film 48. After subsequently forming recesses 58 for protective film at top portions of the interconnects 50, a first protective film 52 is formed selectively on exposed surfaces of the interconnects 50 (steps 1 to 7).

The substrate after the formation of the first protective film 52 is transported by the second transport robot 32 to the second protective film-forming unit 24, where a second protective film 54 is formed on the surface of the substrate, as shown in FIG. 14A, (step 8). The substrate after the formation of the second protective film 54 is transported by the second transport robot 32 to the second flattening unit 30.

In the second flattening unit 30, as shown in FIG. 14B, a surface of the second protective film 54 is flattened by, for example, chemical-mechanical polishing, electrolytic polishing or heat reflowing (step 9).

The substrate after the flattening of the surface of the second protective film 54 is transported by the second transport robot 32 to the interlevel insulating film-forming unit 26, where an interlevel insulating film 56 is formed on the surface of the substrate, as shown in FIG. 14C (step 10). Since the surface of the second protective film 54 has been flattened in the preceding step, the interlevel insulating film 56 can have a flat surface.

Figure 16A:
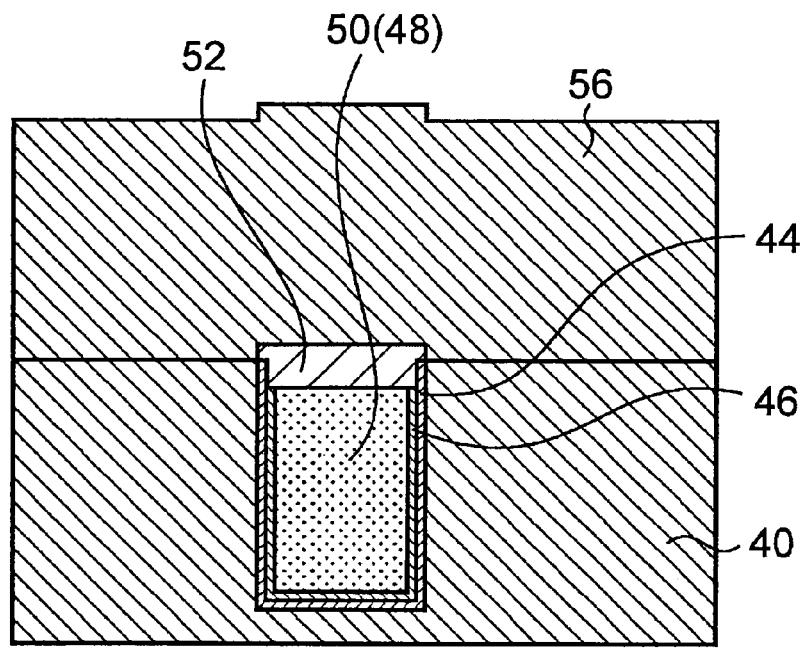
FIGS. 16A and 16B are diagrams illustrating, in sequence of process steps, an interconnects-forming method according to a sixth embodiment of the present invention, showing the process from the formation of an interlevel insulating film.
Figure 16B:
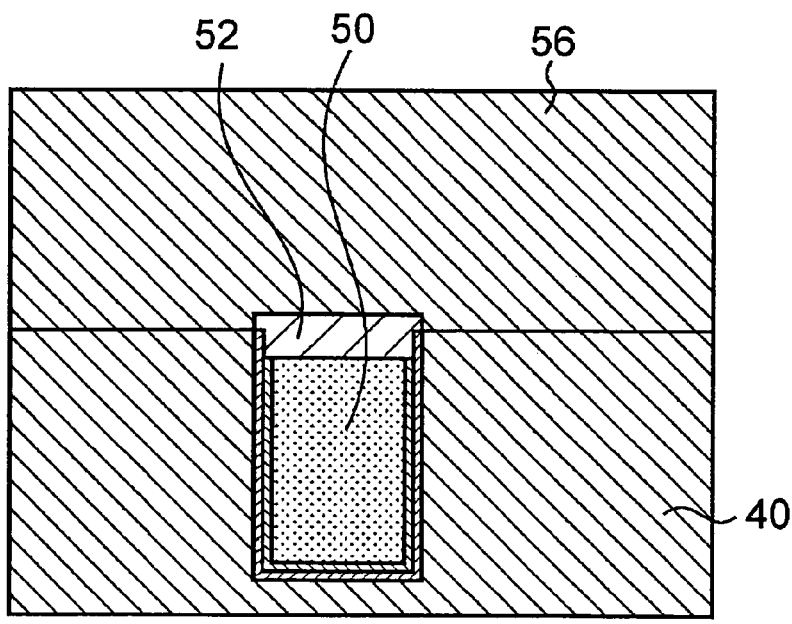
Figure 17:
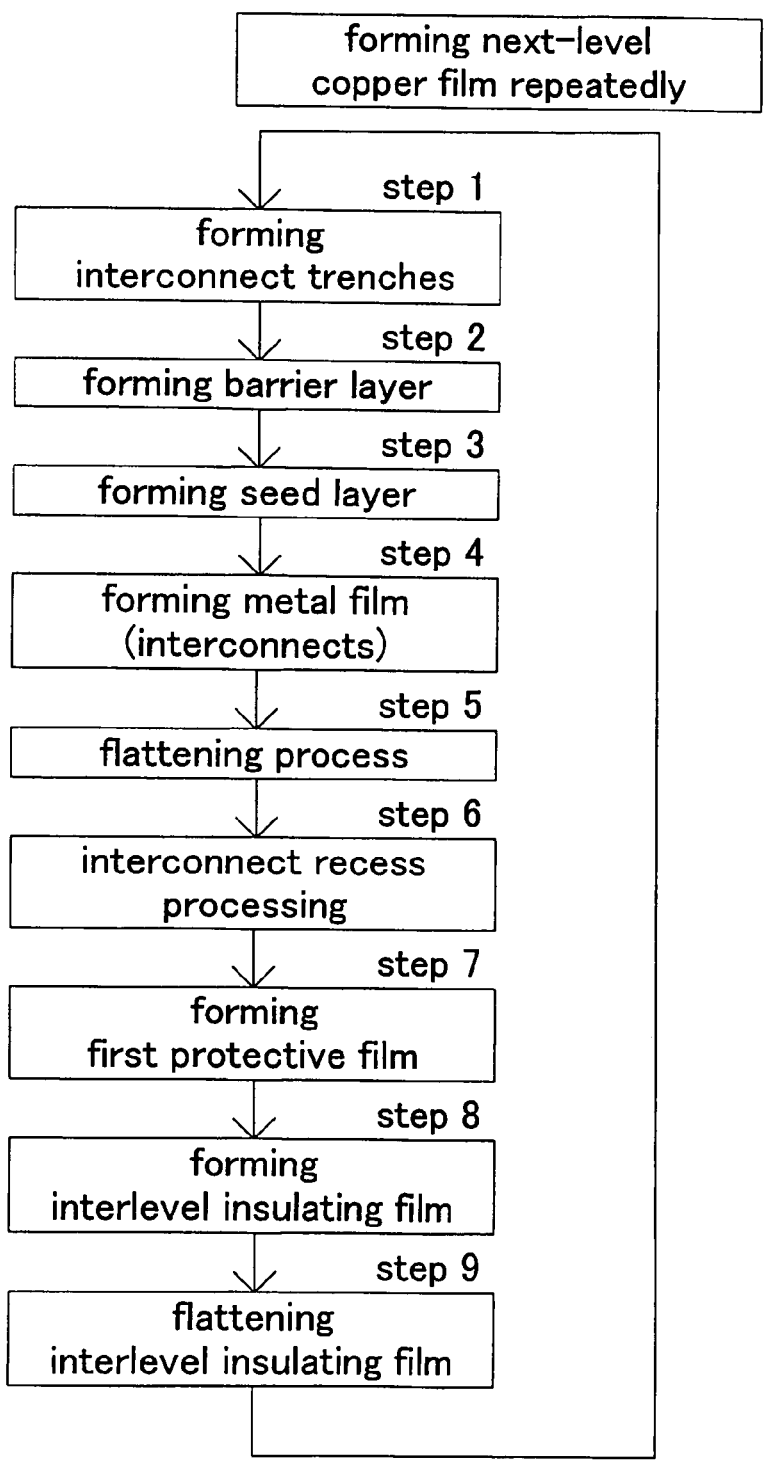
FIG. 17 is a block diagram showing the process steps of the film-forming method according to the sixth embodiment of the present invention.

FIGS. 16A through 17 illustrate an interconnects-forming method according to a sixth embodiment of the present invention. This embodiment differs from the above-described fourth embodiment in the respects described below. According to this embodiment, as in the above-described third embodiment, the second protective film-forming unit 24 shown in FIG. 2 is omitted.

First, as with the fourth embodiment, interconnect trenches (interconnect recesses) 42 are formed in an insulating film 40 formed in a surface of a substrate, and a barrier layer 44 and a seed layer 46 are formed in this order on a surface of the insulating film 40. Further, a metal film (copper film) 48 of copper is formed on a surface of the seed layer 46. Thereafter, the extra metal material other than the metal material in the interconnect trenches 42 is removed and the substrate surface is flattened to thereby form interconnects 50 composed of the copper film 48. After subsequently forming recesses 58 for protective film at top portions of the interconnects 50, a first protective film 52 is formed selectively on exposed surfaces of the interconnects 50 (steps 1 to 7).

The substrate after the formation of the first protective film 52 is transported by the second transport robot 32 to the interlevel insulating film-forming unit 26, where an interlevel insulating film 56 is formed on the surface of the substrate, as shown in FIG. 16A (step 8). Next, the substrate after the formation of the interlevel insulating film 56 is transported by the second transport robot 32 to the second flattening unit 30, where a surface of the interlevel insulating film 56 is flattened, as shown in FIG. 16B (step 9).

Though the above embodiments illustrate the case of using copper as an interconnect material, it is possible to use a copper alloy, silver, a silver alloy, etc. instead of copper.

As described in detail here in above, according to the present invention, flattening the surface of an interlevel insulating film can minimize the lowering of processing accuracy in later etching, light exposure or the like processing for the formation of interconnect recesses in the interlevel insulating film in the production of multi-level interconnects. Furthermore, by optimally controlling the film thickness of a first protective film when it is formed selectively on the surfaces of inter connects, it becomes possible to improve the electro migration resistance of interconnects, without impairing the electrical properties of interconnects, and enhance the reliability of the device.

What is claimed is:

1. An interconnects-forming method, comprising:
providing interconnect recesses in an insulating film formed on a surface of a substrate;
embedding an interconnect material in the interconnect recesses while forming a metal film of the interconnect material on a surface of the insulating film;
removing an extra metal material other than the metal material in the interconnect recesses and flattening the substrate surface, thereby forming interconnects;
forming a first protective film of a conductive material selectively on exposed surfaces of the interconnects;
forming a second protective film on the entire surface of the substrate having the thus-formed first protective film;
forming an interlevel insulating film on the surface of the substrate having the thus-formed second protective film; and flattening a surface of the interlevel insulating film.

2. The interconnects-forming method according to claim 1, wherein interconnect recesses are provided in the interlevel insulating film, and an interconnect material is embedded in the interconnect recesses to make a multi-level interconnect structure.

3. The interconnects-forming method according to claim 1, wherein the flattening of the surface of the interlevel insulating film is carried out by chemical-mechanical polishing, wet etching with a chemical, or heat reflowing.

4. The interconnects-forming method according to claim 1, wherein the first protective film is composed of Co, a Co alloy, Ni, a Ni alloy, Mo, a Mo alloy, Ta, a Ta alloy, Ta nitride, WN, ZrN, Ti, a Ti alloy or Ti nitride.

5. The interconnects-forming method according to claim 1, wherein after the formation of interconnects by removing the extra metal material other than the metal material in the interconnect recesses and flattening the substrate surface, recesses for protective film are formed at the top portions of the interconnects.

6. The interconnects-forming method according to claim 5, wherein the recesses for protective film are formed by chemical-mechanical polishing, electrolytic polishing, dry etching with a plasma or wet etching with a chemical.

7. The interconnects-forming method according to claim 5, wherein the depth of the recesses for protective film is from 5 nm to 50 nm.

8. The interconnects-forming method according to claim 1, wherein the film thickness of the first protective film is from 5 nm to 65 nm.

9. The interconnects-forming method according to claim 1, wherein the first protective film is formed by electroless plating.

10. The interconnects-forming method according to claim 9, wherein in advance of the electroless plating, a metal ion-containing catalyst is applied to the exposed surfaces of the interconnects.

11. The interconnects-forming method according to claim 9, wherein the film-forming rate in the electroless plating is from 3 nm/min to 18 nm/min.

12. The interconnects-forming method according to claim 1, wherein the first protective film has a protruding portion which protrudes from the surface of the insulating film.

13. The interconnects-forming method according to claim 12, wherein a height of the protruding portion of the first protective film above a surface plane of the insulating film is approximately equal to the film thickness of a barrier layer which has been formed on the surfaces of the interconnect recesses prior to the formation of the metal film.

14. An interconnects-forming method, comprising:
providing interconnect recesses in an insulating film formed on a surface of a substrate;
embedding an interconnect material in the interconnect recesses while forming a metal film of the interconnect material on a surface of the insulating film;
removing an extra metal material other than the metal material in the interconnect recesses and flattening the substrate surface, thereby forming interconnects;
forming a first protective film of a conductive material selectively on exposed surfaces of the interconnects;
forming a second protective film on the surface of the substrate having the thus-formed first protective film;
flattening a surface of the second protective film; and
forming an interlevel insulating film on the flattened surface of the second protective film.

15. The interconnects-forming method according to claim 14, wherein interconnect recesses are provided in the interlevel insulating film, and an interconnect material is embedded in the interconnect recesses to make a multi-level interconnect structure.

16. The interconnects-forming method according to claim 14, wherein the flattening of the surface of the second protective film is carried out by chemical-mechanical polishing or heat reflowing.

17. The interconnects-forming method according to claim 14, wherein the first protective film is composed of Co, a Co alloy, Ni, a Ni alloy, Mo, a Mo alloy, Ta, a Ta alloy, Ta nitride, WN, ZrN, Ti, a Ti alloy or Ti nitride.

18. The interconnects-forming method according to claim 14, wherein the second protective film is composed of SixNy, SiC, SiCN, SiCO or a borazine-silicon polymer.

19. The interconnects-forming method according to claim 14, wherein after the formation of interconnects by removing the extra metal material other than the metal material in the interconnect recesses and flattening the substrate surface, recesses for protective film are formed at the top portions of the interconnects.

20. The interconnects-forming method according to claim 19, wherein the recesses for protective film are formed by chemical-mechanical polishing, electrolytic polishing, dry etching with a plasma or wet etching with a chemical.

21. The interconnects-forming method according to claim 19, wherein the depth of the recesses for protective film is from 5 nm to 50 nm.

22. The interconnects-forming method according to claim 14, wherein the film thickness of the first protective film is from 5 nm to 65 nm.

23. The interconnects-forming method according to claim 14, wherein the first protective film is formed by electroless plating.

24. The interconnects-forming method according to claim 23, wherein in advance of the electroless plating, a metal ion-containing catalyst is applied to the exposed surfaces of the interconnects.

25. The interconnects-forming method according to claim 23, wherein the film-forming rate in the electroless plating is from 3 nm/min to 18 nm/min.

26. The interconnects-forming method according to claim 14, wherein the first protective film has a protruding portion which protrudes from the surface of the insulating film.

27. The interconnects-forming method according to claim 26, wherein a height of the protruding portion of the first protective film above a surface plane of the insulating film is approximately equal to the film thickness of a barrier layer which has been formed on the surfaces of the interconnect recesses prior to the formation of the metal film.

28. An interconnects-forming method, comprising:
providing interconnect recesses in an insulating film formed in on a surface of a substrates, a barrier layer being formed on surfaces of the interconnect recesses;
embedding an interconnect material in the interconnect recesses having the barrier layer while forming a metal film of the interconnect material on a surface of the insulating film;
removing an extra metal material other than the metal material in the interconnect recesses and flattening the substrate surface, thereby forming interconnects;
forming a first protective film of a conductive material selectively on exposed surfaces of the interconnects such that the first protective film has a protruding portion which protrudes from the surface of the insulating film, a height of the protruding portion above a surface plane of the insulating film being approximately equal to a film thickness of the barrier layer;

forming an interlevel insulating film on the surface of the substrate having the thus-formed first protective film; and flattening a surface of the interlevel insulating film.

29. The interconnects-forming method according to claim 28, wherein interconnect recesses are provided in the interlevel insulating film, and an interconnect material is embedded in the interconnect recesses to make a multi-level interconnect structure.

30. The interconnects-forming method according to claim 28, wherein the flattening of the surface of the interlevel insulating film is carried out by chemical-mechanical polishing, wet etching with a chemical, or heat reflowing.

31. The interconnects-forming method according to claim 28, wherein the first protective film is composed of Co, a Co alloy, Ni, a Ni alloy, Mo, a Mo alloy, Ta, a Ta alloy, Ta nitride, WN, ZrN, Ti, a Ti alloy or Ti nitride.

32. The interconnects-forming method according to claim 28, wherein after the formation of interconnects by removing the extra metal material other than the metal material in the interconnect recesses and flattening the substrate surface, recesses for protective film are formed at the top portions of the interconnects.

33. The interconnects-forming method according to claim 32, wherein the recesses for protective film are formed by chemical-mechanical polishing, electrolytic polishing, dry etching with a plasma or wet etching with a chemical.

34. The interconnects-forming method according to claim 32, wherein the depth of the recesses for protective film is from 5 nm to 50 nm.

35. The interconnects-forming method according to claim 28, wherein the film thickness of the first protective film is from 5 nm to 65 nm.

36. The interconnects-forming method according to claim 28, wherein the first protective film is formed by electroless plating.

37. The interconnects-forming method according to claim 36, wherein in advance of the electroless plating, a metal ion-containing catalyst is applied to the exposed surfaces of the interconnects.

38. The interconnects-forming method according to claim 36, wherein the film-forming rate in the electroless plating is from 3 nm/min to 18 nm/min.

39. An interconnects-forming method, comprising:

providing interconnect recesses in an insulating film formed on a surface of a substrate;

embedding an interconnect material in the interconnect recesses while forming a metal film of the interconnect material on a surface of the insulating film;

removing an extra metal material other than the metal material in the interconnect recesses and flattening the substrate surface, thereby forming interconnects;

forming a first protective film of a conductive material selectively on exposed surfaces of the interconnects;

forming a second protective film of $Si_xN_y$, SiC, SiCN, SiCO or a borazine-silicon polymer on the surface of the substrate having the thus-formed first protective film;

forming an interlevel insulating film on the surface of the substrate having the thus-formed second protective film; and flattening a surface of the interlevel insulating film.

* * * * *

UNITED STATES PATENT AND TRADEMARK OFFICE
CERTIFICATE OF CORRECTION

| | | |
|---|---|---|
| PATENT NO. | : 7,217,653 B2 | Page 1 of 1 |
| APPLICATION NO. | : 10/896014 | |
| DATED | : May 15, 2007 | |
| INVENTOR(S) | : Xinming Wang et al. | |

It is certified that error appears in the above-identified patent and that said Letters Patent is hereby corrected as shown below:

In column 16, line 52, claim 28, replace "formed in on a surface of a substrate," with --formed on a surface of a substrate,--.

Signed and Sealed this

Seventh Day of August, 2007

JON W. DUDAS
*Director of the United States Patent and Trademark Office*